(12) United States Patent
Durse et al.

(10) Patent No.: US 12,272,909 B2
(45) Date of Patent: Apr. 8, 2025

(54) HIGH POWER ELECTRICAL HEADER CONNECTOR WITH COOLING FEATURES

(71) Applicant: Aptiv Technologies AG, Schaffhausen (CH)

(72) Inventors: Nicholas A. Durse, Youngstown, OH (US); Don E. Bizon, Boardman, OH (US); Patrick Joseph Reedy, Youngstown, OH (US); Steven W. Marzo, Cortland, OH (US)

(73) Assignee: Aptiv Technologies AG, Schaffhausen (CH)

( * ) Notice: Subject to any disclaimer, the term of this patent is extended or adjusted under 35 U.S.C. 154(b) by 485 days.

(21) Appl. No.: 17/742,603

(22) Filed: May 12, 2022

(65) Prior Publication Data

US 2022/0368090 A1 Nov. 17, 2022

Related U.S. Application Data

(60) Provisional application No. 63/195,223, filed on Jun. 1, 2021, provisional application No. 63/187,588, filed on May 12, 2021.

(51) Int. Cl.
*H01R 25/14* (2006.01)
*H01R 13/502* (2006.01)
(Continued)

(52) U.S. Cl.
CPC ........... *H01R 25/14* (2013.01); *H01R 13/502* (2013.01); *H01R 13/533* (2013.01); *H05K 7/20218* (2013.01); *H01R 2201/26* (2013.01)

(58) Field of Classification Search
CPC .... H01R 25/14; H01R 13/502; H01R 13/533; H01R 2201/26; H01R 13/62;
(Continued)

(56) References Cited

U.S. PATENT DOCUMENTS

| | | |
|---|---|---|
| 10,756,498 B1 | 8/2020 | Sarraf et al. |
| 2001/0014551 A1* | 8/2001 | Blashewski ............ H05K 3/306 |
| | | 439/378 |

(Continued)

FOREIGN PATENT DOCUMENTS

| | | | |
|---|---|---|---|
| DE | 102015016267 A1 * | 7/2016 | ............ H01R 13/53 |
| DE | 102020118120 A1 | 2/2021 | |
| EP | 3700022 A1 | 8/2020 | |

OTHER PUBLICATIONS

Extended European Search Report mailed on Oct. 7, 2022, 8 pages.
"Communication Pursuant to Article 94(3) EPC"; European Patent Office; mailed on Aug. 29, 2024; 11 Pages.

*Primary Examiner* — Tulsidas C Patel
*Assistant Examiner* — Jeffrey Mountain
(74) *Attorney, Agent, or Firm* — Billion & Armitage

(57) ABSTRACT

An electrical connector assembly includes a connector housing, a planar busbar having a rectangular cross section defining two opposed major surfaces and four minor surfaces, a cooling plate that is sized, shaped, and arranged to be in conductive thermal contact with a first major surface of the planar busbar, and an L-shaped busbar partially disposed within the connector housing having a first end connected to an electrical terminal and having a second end attached to, and in conductive thermal contact with, a second major surface of the planar busbar. The cooling plate is configured to reduce a temperature of the planar busbar and the attached L-shaped busbar. A method of assembling such an electrical connector is also presented.

16 Claims, 5 Drawing Sheets

(51) Int. Cl.
*H01R 13/533* (2006.01)
*H05K 7/20* (2006.01)

(58) Field of Classification Search
CPC ...... H01R 13/621; H01R 27/00; H01R 33/94; H01R 2201/00; H05K 7/20218
USPC ........................................................ 439/76.2
See application file for complete search history.

(56) References Cited

U.S. PATENT DOCUMENTS

2018/0277986 A1\* 9/2018 Eckel .................... H05K 7/2039
2020/0266578 A1 8/2020 Durse et al.

\* cited by examiner

HIGH POWER ELECTRICAL HEADER CONNECTOR WITH COOLING FEATURES

CROSS-REFERENCE TO RELATED APPLICATION

This application claims the benefit of priority to U.S. Provisional Patent Application No. 63/187,588 filed on May 12, 2021, and U.S. Provisional Patent Application No. 63/195,223 filed on Jun. 1, 2021, the entire disclosure of each of which is hereby incorporated by reference.

TECHNICAL FIELD

The invention relates to electrical connector assemblies, particularly high-power electrical connector assemblies with cooling features.

BACKGROUND

High power electrical connector assemblies, such as those used in electrical vehicles, may be required to conduct 90 kilowatts or more of electrical power. Electrical contact resistance between electrical elements in the electrical connector assembly causes power losses which are converted to thermal energy within the connector assembly. This thermal energy can cause a temperature rise within the electrical connector assembly that may damage the electrical connector assembly and/or surrounding components by overheating if thermal limits are exceeded. In order to prevent damage from overheating, the conductive components of the electrical connector assembly, including the electrical cables, are upsized to carry additional current, thereby "derating" the connector to compensate for the resistive heating.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY

According to an embodiment, an electrical connector assembly is provided. The electrical connector assembly includes a connector housing, a planar busbar having a rectangular cross section defining two opposed major surfaces and four minor surfaces, a cooling plate that is sized, shaped, and arranged to be in conductive thermal contact with a first major surface of the planar busbar, and an L-shaped busbar partially disposed within the connector housing having a first end connected to an electrical terminal and having a second end attached to, and in conductive thermal contact with, a second major surface of the planar busbar. The cooling plate is configured to reduce a temperature of the planar busbar and the attached L-shaped busbar.

In an example embodiment having one or more features of the electrical connector assembly of the previous paragraph, the electrical connector assembly further includes an electrically insulative and thermally conductive pad disposed between the second major surface of the planar busbar and the cooling plate.

In an example embodiment having one or more features of the electrical connector assembly any one of the previous paragraphs, the L-shaped busbar is attached to the planar busbar by a threaded fastener. The threaded fastener has a head with an outer surface that is flush with, or shy from, the second major surface.

In an example embodiment having one or more features of the electrical connector assembly any one of the previous paragraphs, the electrical connector assembly further includes a pair of the planar busbar, a pair of the L-shaped busbar, and a pair of the electrical terminal. Each planar bus bar of the pair of planar busbars is connected to one L-shaped busbar of the pair of L-shaped busbars and one electrical terminal of the pair of electrical terminals.

In an example embodiment having one or more features of the electrical connector assembly any one of the previous paragraphs, the electrical connector assembly further includes a cooling plate retainer formed of an insulative material and disposed between the cooling plate and the connector housing.

In an example embodiment having one or more features of the electrical connector assembly any one of the previous paragraphs, the cooling plate retainer and the cooling plate are separated from the connector housing by a plurality of stand-offs.

In an example embodiment having one or more features of the electrical connector assembly any one of the previous paragraphs, the cooling plate retainer defines a snap feature that is configured to secure the cooling plate retainer to the cooling plate.

In an example embodiment having one or more features of the electrical connector assembly any one of the previous paragraphs, the cooling plate retainer and the cooling plate define alignment features that are configured to align the cooling plate retainer with the cooling plate.

In an example embodiment having one or more features of the electrical connector assembly any one of the previous paragraphs, the cooling plate includes a coolant channel that is configured to allow a liquid coolant to flow into an inlet port of the cooling plate, through the coolant channel, and out of an outlet port of the cooling plate.

In an example embodiment having one or more features of the electrical connector assembly any one of the previous paragraphs, the cooling plate further includes a first section defining the inlet port and the outlet port and a second section having an outer surface in thermally conductive contact with the first major surface of the planar busbar.

According to another embodiment of the invention, a method of assembling an electrical connector is provided. The method includes the step of providing the electrical connector which has a connector housing, a cooling plate, a planar busbar having a rectangular cross section and defining two opposed major surfaces and four minor surfaces, and an L-shaped busbar partially disposed within the connector housing. A first end of the L-shaped busbar is connected to an electrical terminal disposed within the connector housing. The method also includes the steps of placing a first major surface of the planar busbar in conductive thermal contact with the cooling plate, attaching a second end of the L-shaped busbar to a second major surface of the planar busbar such that the second end is in intimate contact with the second major surface, and securing the cooling plate to the connector housing. The cooling plate is configured to reduce a temperature of the planar busbar and the attached L-shaped busbar.

In an example embodiment having one or more features of the method of the previous paragraph, the method further includes the step of disposing a pad between the second major surface of the planar busbar and the cooling plate. The pad is thermally conductive and electrically insulative.

In an example embodiment having one or more features of the method of one of the previous paragraphs, the method further includes the step of attaching the L-shaped busbar to the planar busbar by a threaded fastener. A head of the treaded fastener has an outer surface that is flush with, or shy from, the second major surface.

In an example embodiment having one or more features of the method of one of the previous paragraphs, the method further includes the step of disposing a cooling plate retainer formed of an insulative material between the cooling plate and the connector housing.

In an example embodiment having one or more features of the method of one of the previous paragraphs, the method further includes the step of separating the cooling plate retainer and the cooling plate from the connector housing using a plurality of stand-offs.

In an example embodiment having one or more features of the method of one of the previous paragraphs, the cooling plate includes a coolant channel that is configured to allow a liquid coolant to flow into the cooling plate via an inlet port, through the coolant channel, and out of the cooling plate through an outlet port.

According to yet another embodiment of the invention, an electrical connector assembly is provided. The electrical connector assembly includes a connector housing, a planar busbar having a rectangular cross section defining two opposed major surfaces and four minor surfaces, an L-shaped busbar partially disposed within the connector housing having a first end connected to an electrical terminal and having a second end attached to, and in conductive thermal contact with, a second major surface of the planar busbar, and a means for reducing a temperature of the planar busbar and the L-shaped busbar.

DESCRIPTION OF THE DRAWINGS

The present invention will now be described, by way of example with reference to the accompanying drawings, in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without all of these specific details. In other instances, well-known methods, procedures, components, circuits, and networks have not been described in detail so as not to unnecessarily obscure aspects of the embodiments.

Figure 1:
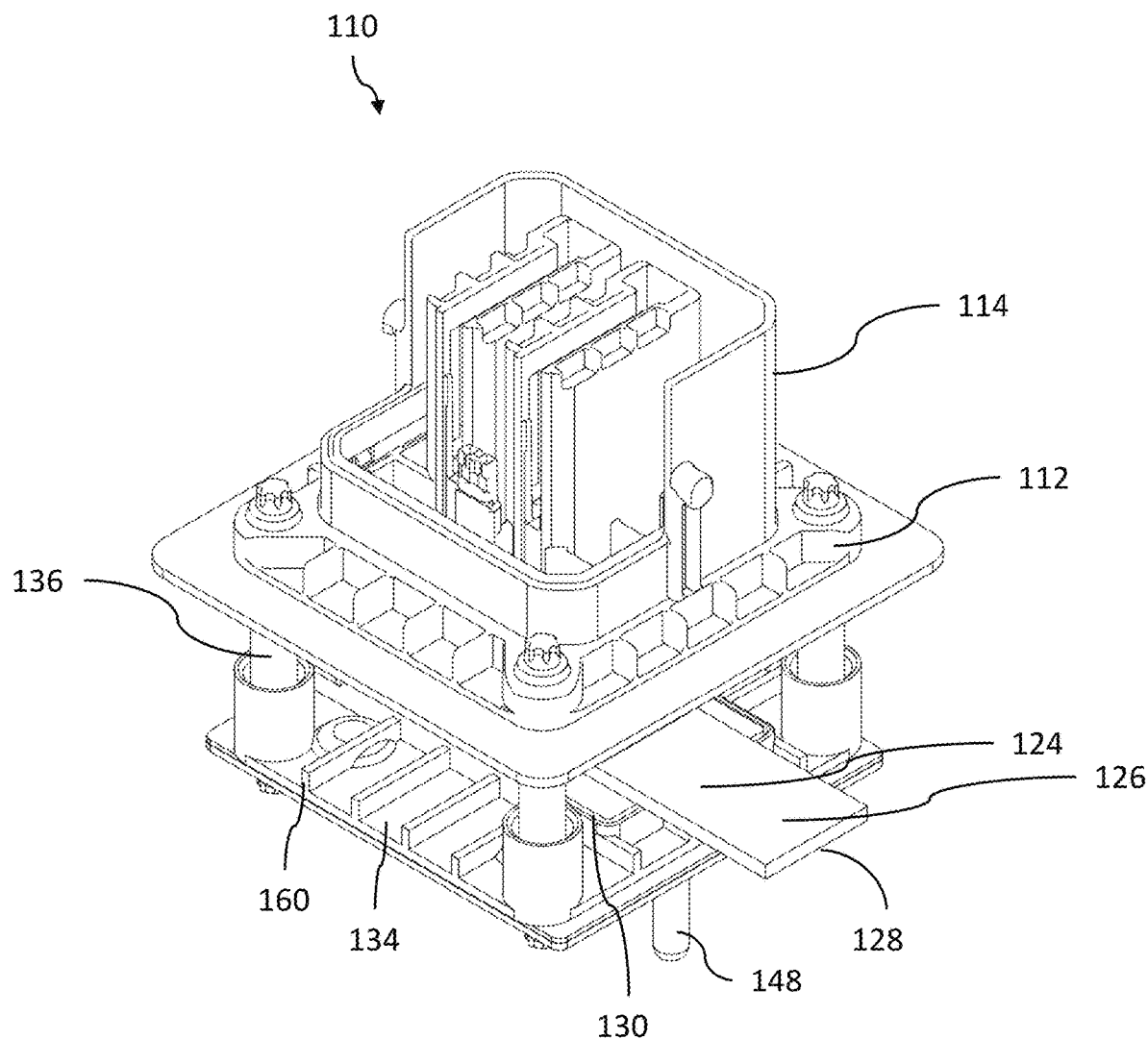
FIG. 1 is perspective assembly view of an electrical connector assembly according to an embodiment.
Figure 2:
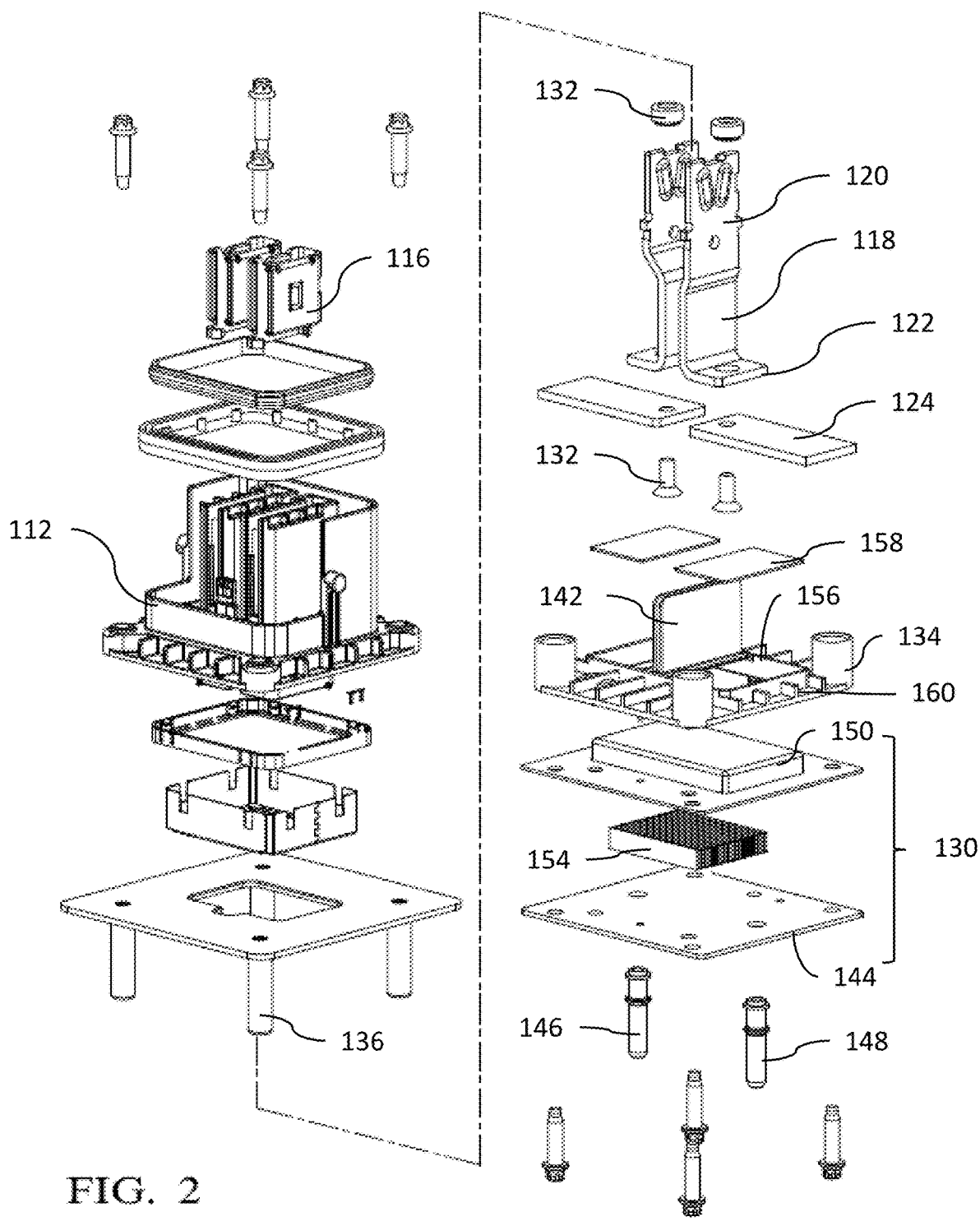
FIG. 2 is an exploded side view of the electrical connector assembly of FIG. 1 according to an embodiment.
Figure 3:
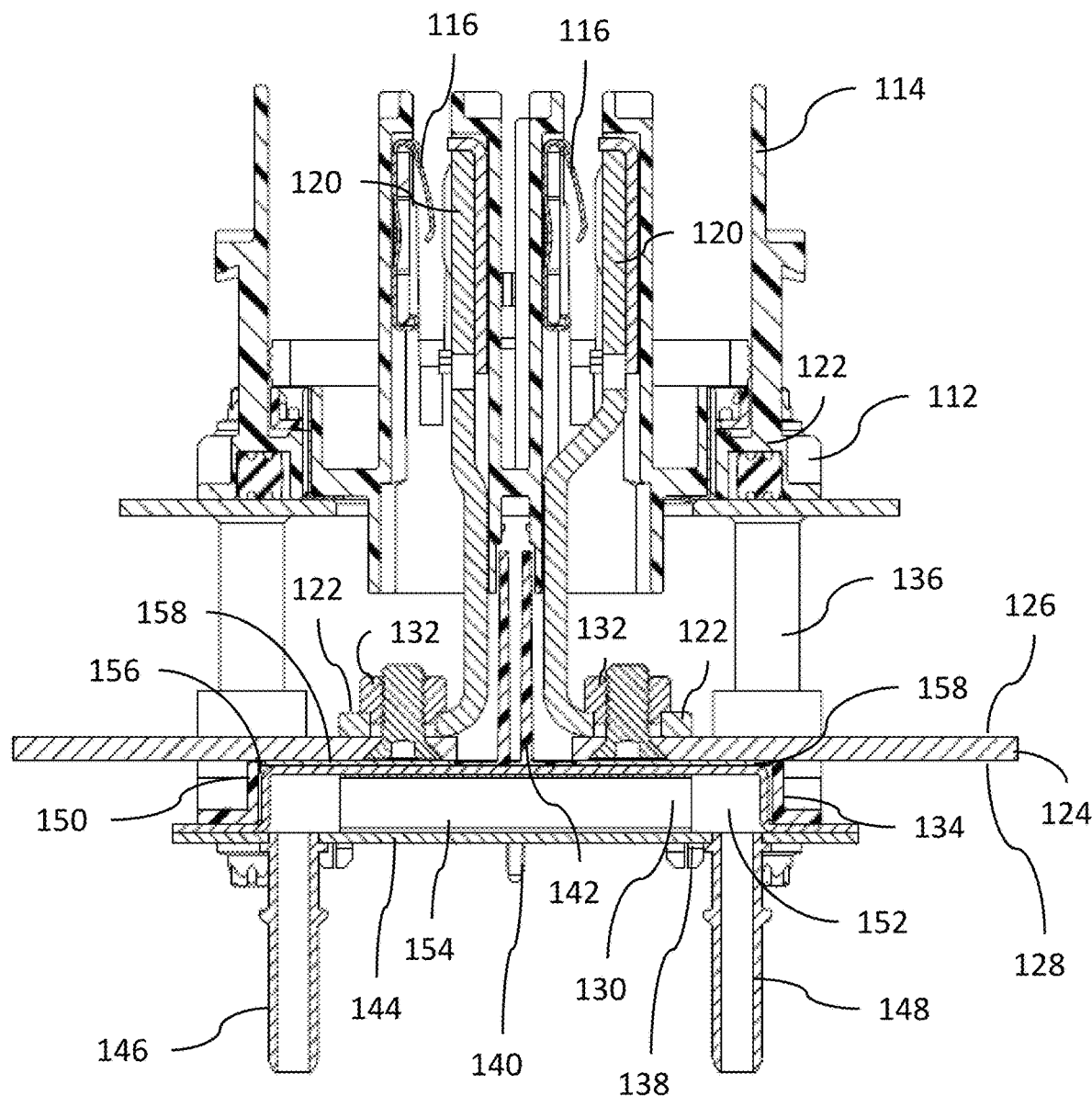
FIG. 3 is a cross section side view of the electrical connector assembly of FIG. 1 according to an embodiment.

A non-limiting example of an embodiment of an electrical connector assembly is illustrated in FIGS. 1-3, hereinafter referred to as the connector 100. The connector 100 is a header type connector that is designed to be mounted on a planar surface, such as a panel of a battery pack or a bulkhead of an electric vehicle. The connector 100 includes an electrically insulative connector housing 112 defining a shroud 114 which partially surrounds a pair of electrical terminals 116. In this example, the electrical terminals 116 are female terminals that are configured to receive corresponding male terminals. The electrical terminals are connected to a pair of L-shaped busbars 118 that are partially disposed within the connector housing 112. As used herein "L-shaped" means that the bus bar has a first planar end 120 that is arranged generally perpendicularly to a second planar ends 122. In the illustrated example, the electrical terminals 116 are connected to the first ends 20 of the L-shaped busbars 118. The connector 100 also includes a pair of planar busbars 124, each having a rectangular cross section defining two opposed major surfaces 126, 128 and four minor surfaces. As used herein, the major surface is distinguished from the minor surface due to the larger surface area of the major surface. The connector 100 further contains means for reducing a temperature of the connector 100 including the planar busbars 124 and the attached L-shaped busbars 118 which includes a cooling plate 130 that is sized, shaped, and arranged to be in conductive thermal contact with a first major surface 126 of the each of the planar busbars 124. The second ends 122 of the L-shaped busbars 118 are attached to, and in conductive thermal contact with, second major surfaces 128 of the planar busbars 124.

In an alternative embodiment, the first ends of the L-shaped busbars may form male terminals that are received within corresponding female terminals located in a mating connector housing.

The L-shaped busbars 118 are attached to the planar busbars 124 by threaded fasteners 132, such as countersunk head cap screws and swedged or self-clinching nuts, e.g., PEM® nuts, into which the cap screws are threaded. As shown in FIG. 3, the heads of the cap screws have outer surfaces that are flush with, or shy from, the second major surfaces 128 when the cap screws are fully tightened. This maximizes an interface surface area between the L-shaped busbars 118 and the planar busbars 124 that would be limited to the surface area of the screw heads if the heads were proud from the second major surfaces 128 when the cap screws are fully tightened.

The connector assembly additionally includes a cooling plate retainer, hereinafter referred to as the retainer 134, that is formed of an insulative material, such as polyamide (NYLON) or polybutylene terephthalate (PBT) and is disposed between the cooling plate 130 and the connector housing 112. The retainer 134 and the cooling plate 130 are separated from the connector housing 112 by a plurality of stand-offs 136. The retainer 134 defines snap features 138 that are configured to secure the retainer 134 to the cooling plate 130. The retainer 134 and the cooling plate 130 define alignment features 140 that are configured to align the retainer 134 with the cooling plate 130. The retainer 134 also defines a fin 142 that projects between the pair of L-shaped busbars 118 to maintain spacing between them and to electrically insulate one L-shaped busbar 118 from the other. The retainer 134 further contains inserts or compression limiters to prevent over torquing of the threaded fasteners 132 that are used to secure the retainer 134 and the cooling plate 130 to the standoffs 136.

The cooling plate 130 includes a bottom section 144 having a liquid inlet port 146 and a liquid outlet port 148 that may be interconnected with the vehicle's cooling system, e.g., a liquid cooling system that cools the vehicle battery pack and/or the vehicle's power electronics. The vehicle's cooling system includes a pump that causes the liquid coolant to flow through the cooling plate. In an alternative embodiment, the liquid inlet port and the liquid outlet port may be interconnected with a cooling system dedicated to cooling the connector. The bottom section may be advantageously formed of a polymeric material to reduce weight and provide better electrical isolation compared to a metal bottom section.

The cooling plate 130 also includes a top section 150 that defines a coolant channel 152 having a plurality of cooling fins 154 through which a liquid coolant flows from the liquid inlet port 146 to the liquid outlet port 148. The top section 150 may be advantageously formed of a metallic material to optimize heat transfer between the cooling fins 154 and the liquid coolant. The top section 150 protrudes through an opening 156 in the retainer 134. The retainer 134 also defines a plurality of stiffening ribs 160 that extend from the opening 156 to the outer edges of the retainer 134.

An electrically insulative and thermally conductive pad 158 is disposed between the second major surface 128 of the planar busbar 124 and the top section 150 of the cooling plate 130. The pad 158 may be formed with a dielectric thermal interface material layer, such as THERM-A-GAP™ GEL 30 distributed by Parker Chomerics of Woburn Massachusetts, that is in direct contact with the planar busbars and an additional dielectric material layer, such as ISOEDGE™ PR4305 distributed by Henkel Corporation of Warren, Michigan in direct contact with the cooling plate. The dielectric thermal interface material layer and the additional dielectric material layer provide robust electrical isolation between the planar busbars and the metallic top section.

Figure 4:
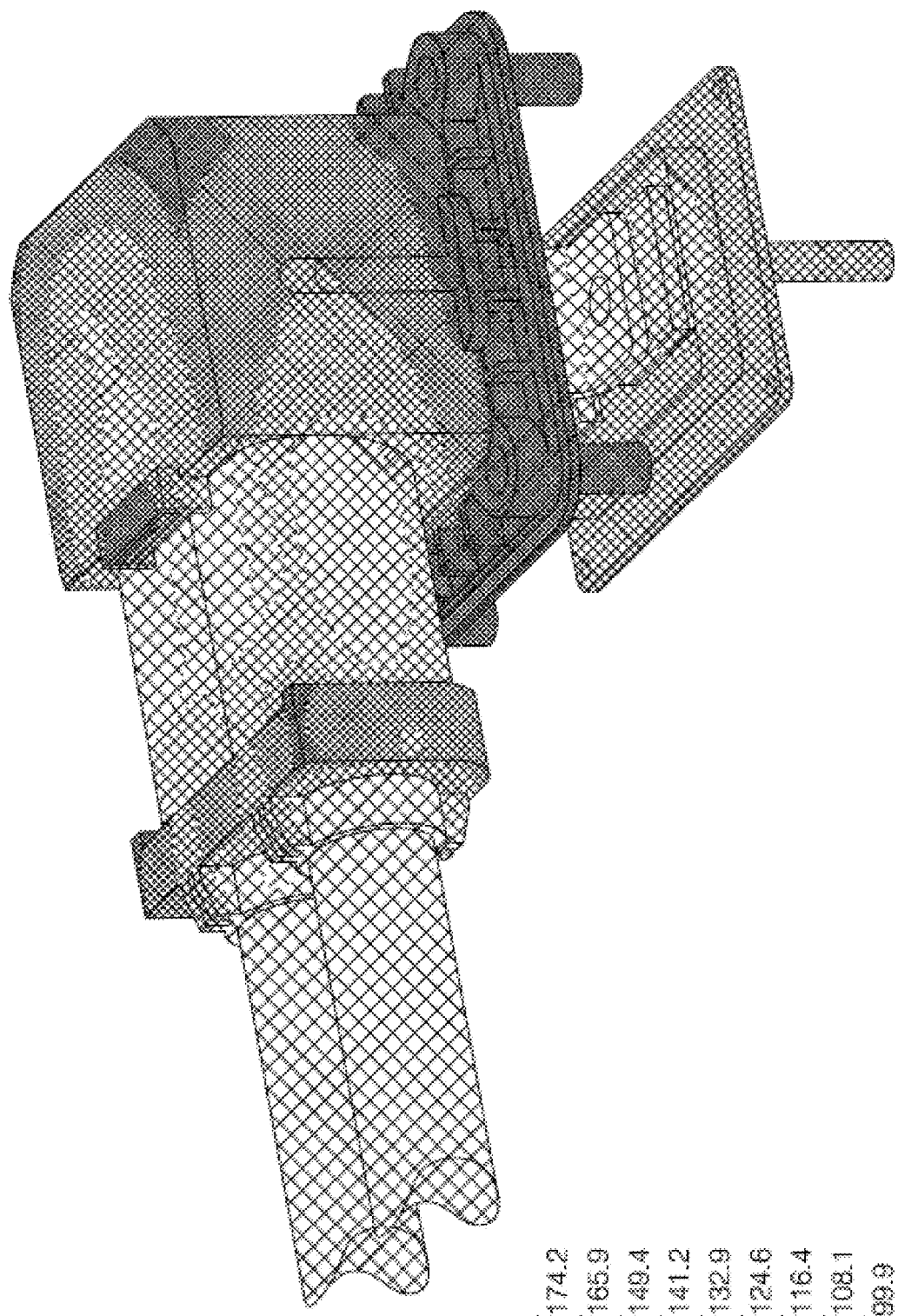
FIG. 4 is a thermal imaging view of the electrical connector assembly of FIG. 1 and a corresponding mating connector according to an embodiment.

The results of thermal modeling of the cooling performance of the connector 100 are shown in FIG. 4.

While the illustrated embodiment of the connector 100 is configured to conduct a liquid coolant, other embodiments of the connector may be envisioned that are configured to conduct a gaseous coolant. In yet other embodiments of the connector, the cooling plate may contain external cooling fins and rely on passive cooling rather than an active coolant flow.

Figure 5:
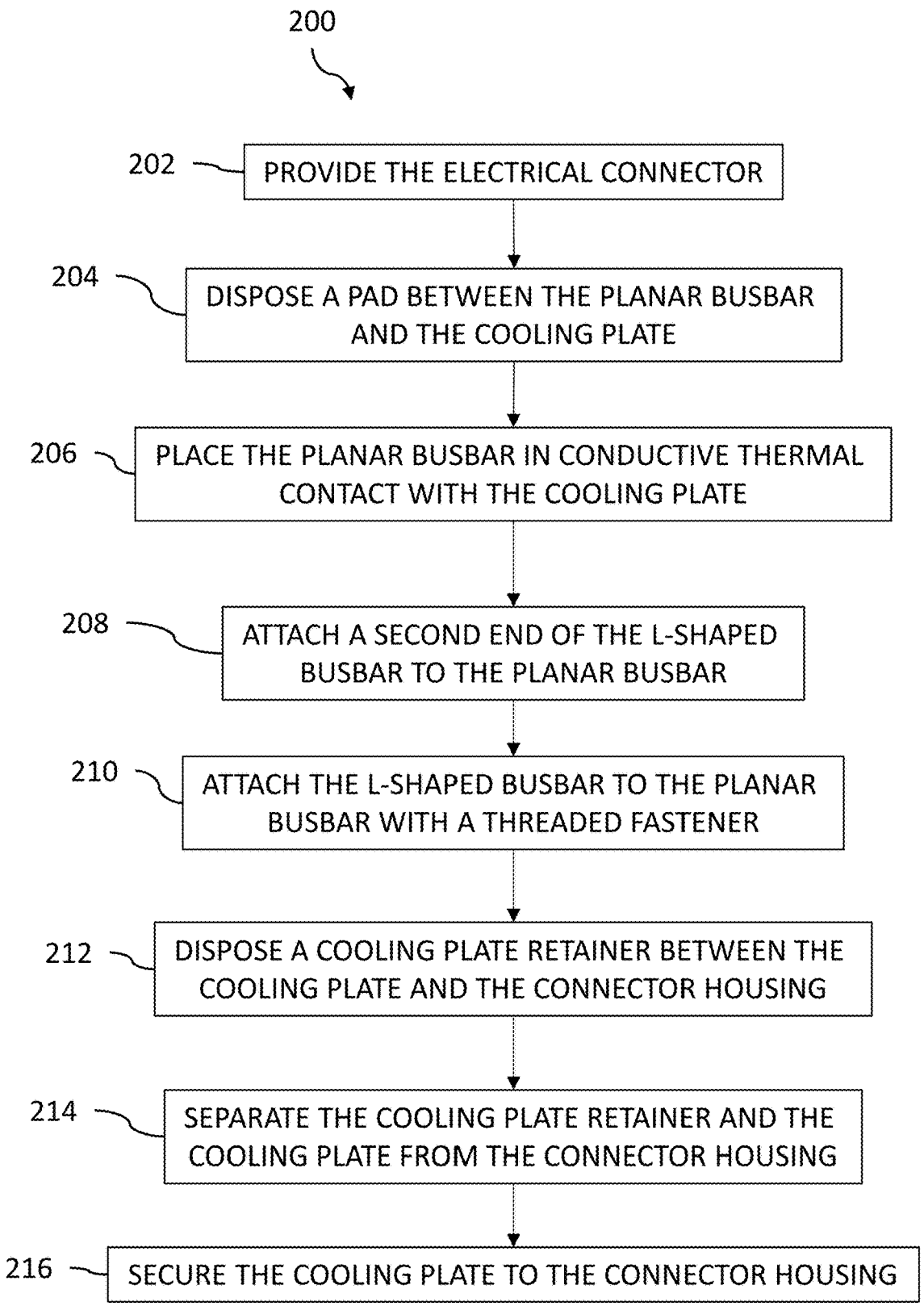
FIG. 5 is a flow chart of a method of assembling the electrical connector assembly of FIG. 1 according to an embodiment.

FIG. 5 shows a flow chart of a method 200 of assembling the connector 100 described above. The method 200 contains the steps of:

STEP 202, PROVIDE THE ELECTRICAL CONNECTOR, includes providing the electrical connector 100 having a connector housing 112, a cooling plate 130, a planar busbar 124 having a rectangular cross section and defining two opposed major surfaces 126, 128 and four minor surfaces, and an L-shaped busbar 118 partially disposed within the connector housing 112. A first end 120 of the L-shaped busbar 118 is connected to an electrical terminal 16 that is disposed within the connector housing 112;

STEP 204, DISPOSE A PAD BETWEEN THE PLANAR BUSBAR AND THE COOLING PLATE, is an optional step which includes disposing a pad 158 between the second major surface 128 of the planar busbar 124 and the cooling plate 130. The pad 158 is thermally conductive and electrically insulative;

STEP 206, PLACE THE PLANAR BUSBAR IN CONDUCTIVE THERMAL CONTACT WITH THE COOLING PLATE, includes placing a first major surface 126 of the planar busbar 124 in conductive thermal contact with the cooling plate 130;

STEP 208, ATTACH A SECOND END OF THE L-SHAPED BUSBAR TO THE PLANAR BUSBAR, includes attaching a second ends 122 of the L-shaped busbar 118 to a second major surface 128 of the planar busbar 124 such that the second ends 122 is in intimate contact with the second major surface 128;

STEP 210, ATTACH THE L-SHAPED BUSBAR TO THE PLANAR BUSBAR WITH A THREADED FASTENER, is an optional step which includes attaching the L-shaped busbar 118 to the planar busbar 124 with a threaded fastener 132, such as a countersunk head cap screw and a swedged or self-clinching nut. A head of the threaded fastener 132 has an outer surface that is flush with, or shy from, the second major surface 128;

STEP 212, DISPOSE A COOLING PLATE RETAINER BETWEEN THE COOLING PLATE AND THE CONNECTOR HOUSING, is an optional step that includes disposing a cooling plate retainer 134 formed of an insulative material between the cooling plate 130 and the connector housing 112;

STEP 214, SEPARATE THE COOLING PLATE RETAINER AND THE COOLING PLATE FROM THE CONNECTOR HOUSING, is an optional step that includes separating the cooling plate retainer 134 and the cooling plate 130 from the connector housing 112 using a plurality of stand-offs 136; and STEP 216, SECURE THE COOLING PLATE TO THE CONNECTOR HOUSING, includes securing the cooling plate 130 to the connector housing 112. The cooling plate 130 is configured to reduce a temperature of the planar busbars 124 and the attached L-shaped busbars 118. The cooling plate 130 includes a coolant channel 152 that is configured to allow a liquid coolant to flow into the cooling plate 130 via an inlet port 146, through the coolant channel 152, and out of the cooling plate 130 through an outlet port 148.

Accordingly, the connector 100 and method of assembling the connector 100 is provided. The connector 100 provides the benefits of thermally managing the temperature of the connector 100 and associated components, such as the wire cables. By reducing the temperature of the connector 100, it is no longer necessary to derate the connector and therefore smaller connector components may be used, thereby reducing material costs and reducing the weight and size of the connector 100. In addition, since the cables that are attached to the connectors no longer need to provide a heat sink, the cable's gauge may also be reduced, further reducing material costs and reducing the weight and size of the cables.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to configure a situation or material to the teachings of the invention without departing from its scope. Dimensions, types of materials, orientations of the various components, and the number and positions of the various components described herein are intended to define parameters of certain embodiments and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any order of operations, direction or orientation unless stated otherwise.

The invention claimed is:

1. An electrical connector assembly, comprising:
a connector housing;
a planar busbar having a rectangular cross section defining two opposed major surfaces and four minor surfaces;
a cooling plate that is sized, shaped, and arranged to be in conductive thermal contact with a first major surface of the planar busbar; and
an L-shaped busbar partially disposed within the connector housing having a first end connected to an electrical terminal and having a second end attached to, and in conductive thermal contact with, a second major surface of the planar busbar, the cooling plate being configured to reduce a temperature of the planar busbar and the attached L-shaped busbar;
a cooling plate retainer formed of an insulative material and disposed between the cooling plate and the connector housing, the cooling plate retainer and the cooling plate being separated from the connector housing by a plurality of stand-offs.

2. The electrical connector assembly of claim 1, further comprising an electrically insulative and thermally conductive pad disposed between the second major surface of the planar busbar and the cooling plate.

3. The electrical connector assembly of claim 1, wherein the L-shaped busbar is attached to the planar busbar by a threaded fastener, wherein the threaded fastener has a head with an outer surface that is flush with the second major surface.

4. The electrical connector assembly of claim 1, wherein the L-shaped busbar is attached to the planar busbar by a threaded fastener, wherein the threaded fastener has a head with an outer surface that is spaced apart from the second major surface.

5. The electrical connector assembly of claim 1, further comprising a pair of the planar busbar, a pair of the L-shaped busbar, and a pair of the electrical terminal, wherein each planar bus bar of the pair of planar busbars is connected to one L-shaped busbar of the pair of L-shaped busbars and one electrical terminal of the pair of electrical terminals.

6. The electrical connector assembly of claim 1, wherein the cooling plate retainer defines a snap feature that is configured to secure the cooling plate retainer to the cooling plate.

7. The electrical connector assembly of claim 1, wherein the cooling plate retainer and the cooling plate define alignment features that are configured to align the cooling plate retainer with the cooling plate.

8. The electrical connector assembly of claim 1, wherein the cooling plate includes a coolant channel that is configured to allow a liquid coolant to flow into an inlet port of the cooling plate, through the coolant channel, and out of an outlet port of the cooling plate.

9. The electrical connector assembly of claim 8, wherein the cooling plate comprises:
a first section defining the inlet port and the outlet port; and
a second section having an outer surface in thermally conductive contact with the second major surface of the planar busbar.

10. A method of assembling an electrical connector, the method comprising:
providing the electrical connector having a connector housing, a cooling plate, a planar busbar having a rectangular cross section and defining two opposed major surfaces and four minor surfaces, and an L-shaped busbar partially disposed within the connector housing, wherein a first end of the L-shaped busbar is connected to an electrical terminal disposed within the connector housing;
placing a first major surface of the planar busbar in conductive thermal contact with the cooling plate;
attaching a second end of the L-shaped busbar to a second major surface of the planar busbar such that the second end is in intimate contact with the second major surface;
securing the cooling plate to the connector housing, wherein the cooling plate is configured to reduce a temperature of the planar busbar and the attached L-shaped busbar;

disposing a cooling plate retainer formed of an insulative material between the cooling plate and the connector housing; and separating the cooling plate retainer and the cooling plate from the connector housing using a plurality of stand-offs.

11. The method of claim 10, further comprising disposing a pad between the second major surface of the planar busbar and the cooling plate, wherein the pad is thermally conductive and electrically insulative.

12. The method of claim 10, further comprising attaching the L-shaped busbar to the planar busbar with a threaded fastener.

13. The method of claim 12, wherein a head of the threaded fastener has an outer surface that is flush with the second major surface.

14. The method of claim 12, wherein a head of the threaded fastener has an outer surface that is spaced apart from the second major surface.

15. The method of claim 10, wherein the cooling plate includes a coolant channel that is configured to allow a liquid coolant to flow into the cooling plate via an inlet port, through the coolant channel, and out of the cooling plate through an outlet port.

16. An electrical connector assembly, comprising:
a connector housing;
a planar busbar having a rectangular cross section defining two opposed major surfaces and four minor surfaces;
an L-shaped busbar partially disposed within the connector housing having a first end connected to an electrical terminal and having a second end attached to, and in conductive thermal contact with, a second major surface of the planar busbar;
a means for reducing a temperature of the planar busbar and the L-shaped busbar; and
a retainer formed of an insulative material and disposed between said means and the connector housing, the retainer and said means being separated from the connector housing by a plurality of stand-offs.

* * * * *